United States Patent [19]
Ishikawa et al.

[11] Patent Number: 5,982,032
[45] Date of Patent: Nov. 9, 1999

[54] ELECTRONIC DEVICE HAVING FETS ON A LOW DIELECTRIC CONSTANT GAAS BASE MEMBER AND PASSIVE ELEMENTS ON A HIGH DIELECTRIC CONSTANT BASE MEMBER

[75] Inventors: Yohei Ishikawa, Kyoto; Koichi Sakamoto, Otsu; Hiroaki Tanaka, Osaka-fu, all of Japan

[73] Assignee: Murata Manufacturing Co., Ltd., Japan

[21] Appl. No.: 08/905,151

[22] Filed: Aug. 1, 1997

[30] Foreign Application Priority Data

Aug. 5, 1996 [JP] Japan .................................. 8-206086

[51] Int. Cl.⁶ .................................................. H01L 23/34
[52] U.S. Cl. .......................... 257/728; 257/725; 257/506
[58] Field of Search .................................. 257/728, 725, 257/528, 724, 506, 501, 524

[56] References Cited

U.S. PATENT DOCUMENTS

| | | |
|---|---|---|
| 4,034,399 | 7/1977 | Drukier et al. .......................... 257/728 |
| 5,325,072 | 6/1994 | Kohjiro et al. .......................... 257/728 |
| 5,446,309 | 8/1995 | Adachi et al. .......................... 257/528 |
| 5,477,085 | 12/1995 | Kose ....................................... 257/728 |
| 5,532,506 | 7/1996 | Tserng .................................... 257/728 |
| 5,675,184 | 10/1997 | Matsubayashi et al. ................ 257/728 |
| 5,689,138 | 11/1997 | Dekker et al. .......................... 257/728 |
| 5,717,249 | 2/1998 | Yoshikawa et al. .................... 257/728 |
| 5,748,046 | 5/1998 | Badger ..................................... 331/17 |
| 5,757,074 | 5/1998 | Matloubian et al. ................... 257/728 |
| 5,767,562 | 6/1998 | Yamashita .............................. 257/500 |

OTHER PUBLICATIONS

JP 5–343605A–in: Patents Abstracts of Japan, Sect. E. vol. 18 (1994), No. 171 (E–1529).
JP 63–20294A–in: Patents Abstracts of Japan, Sect. E. vol. 12 (1988), No. 489 (E–696).

*Primary Examiner*—David B. Hardy
*Assistant Examiner*—Huy Bui
*Attorney, Agent, or Firm*—Ostrolenk, Faber, Gerb & Soffen, LLP

[57] ABSTRACT

An electronic device includes one or more GaAs integrated circuits having a plurality of mutually independent field-effect transistors formed on a GaAs base-member; and one or more high-dielectric-constant base-members including a passive element on a surface thereof or therein.

15 Claims, 2 Drawing Sheets

ELECTRONIC DEVICE HAVING FETS ON A LOW DIELECTRIC CONSTANT GAAS BASE MEMBER AND PASSIVE ELEMENTS ON A HIGH DIELECTRIC CONSTANT BASE MEMBER

BACKGROUND OF THE INVENTION

1. Field of the Invention

The present invention relates to electronic devices, and more particularly, to an electronic device for use in a communication apparatus or the like using a microwave or millimeter wave band.

2. Description of the Related Art

FIG. 3 shows an example of a conventional electronic device for use in a microwave or millimeter wave band. The electronic device 200 includes functional blocks: an oscillator module 201, a resonator 202, a multiplier module 203, a filter module 204, a mixer module 205 and an amplifier module 206, which are encapsulated in a package, and which are mounted on a base member 207 to be connected to an external circuit. Such a structure is called a discrete MIC (microwave integrated circuit).

FIG. 4 shows another example of a conventional electronic device. The electronic device 300 is formed by integrating most of the functional blocks into one integrated circuit (IC). In other words, on a GaAs base-member 301 are formed an oscillator 302, a multiplier 303, a filter 304, a mixer 305, and an amplifier 306. Such a structure is called an MMIC (monolithic MIC). Since no portion corresponding to the resonator 202 included in the structure in FIG. 3 is formed on the GaAs IC, it is not completely integrated.

In the discrete-MIC-structure electronic device, each functional block is packaged, and the packaged blocks are arranged to form one electronic device. This makes it impossible to reduce the size of the electronic device.

In the MMIC-structure electronic device, an advantageous size reduction can be obtained. However, the IC is fundamentally designed to meet a particular requirement, which limits the amount of production, and increases production costs and the degree of integration. Thus, the yield per wafer deteriorates disadvantageously. In addition, since the resonator cannot be integrated into the conventional example in FIG. 4, there are some functions which cannot be performed by the integrated MMIC. In this case the resonator is externally mounted, which undercuts the merits of any size reduction that may be obtained.

SUMMARY OF THE INVENTION

To solve these problems, the present invention is able to improve upon the conventional devices shown in FIGS. 3 and 4 and provide an improved electronic device whose size and cost can be reduced, and with which a high yield is realized.

The foregoing feature may be achieved through provision of an electronic device including: one or more GaAs integrated circuits (ICs) having a plurality of field-effect transistors (FETs) formed on a GaAs base-member so as to be mutually independent; and one or more high-dielectric-constant base-members including a passive element on a surface thereof or therein.

Preferably, the plurality of FETs formed on the GaAs base-member have an identical structure.

The one or more GaAs ICs and the one or more high-dielectric-constant base-members may be mounted in one package to form a multi-chip module structure.

The dielectric constant of the one or more high-dielectric-constant base-members may be greater than the dielectric constant of the GaAs base-member.

The above-described electronic device has passive elements formed on high-dielectric-constant base-members, so the passive elements can be made small-sized by the wave-length shortening effect on the high dielectric constant. Also present are matching circuits, and active elements comprising a plurality of general-purpose FETs formed on a GaAs IC so as to be mutually independent, and other advantageous features. Therefore, a small-sized electronic device can be provided at low cost and with a high yield.

DESCRIPTION OF AN EMBODIMENT OF THE INVENTION

Figure 1:
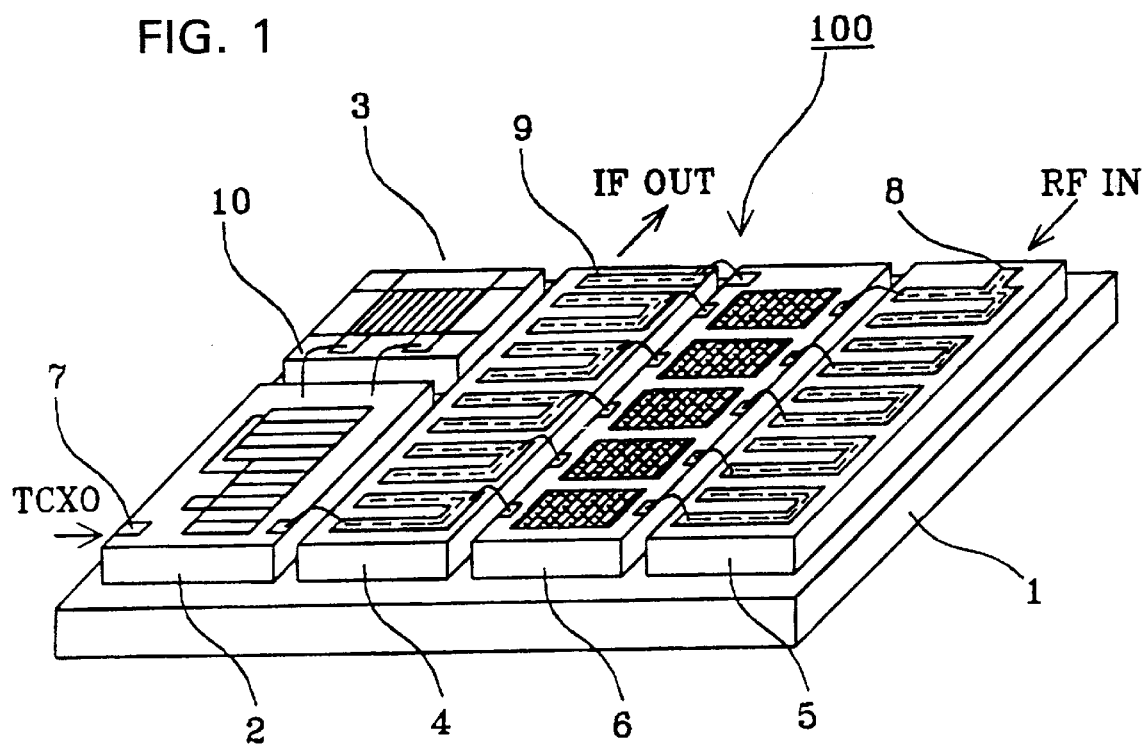
FIG. 1 is a perspective view illustrating an electronic device according to an embodiment of the present invention.
Figure 2:
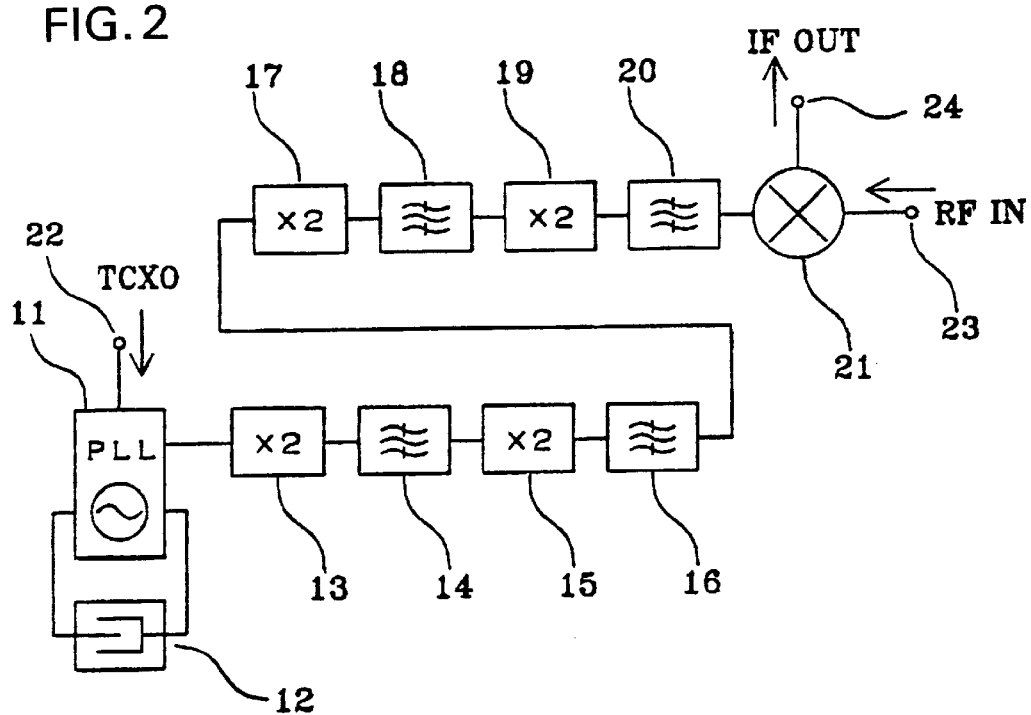
FIG. 2 is a block diagram showing the equivalent circuit of the embodiment shown in FIG. 1.
Figure 3:
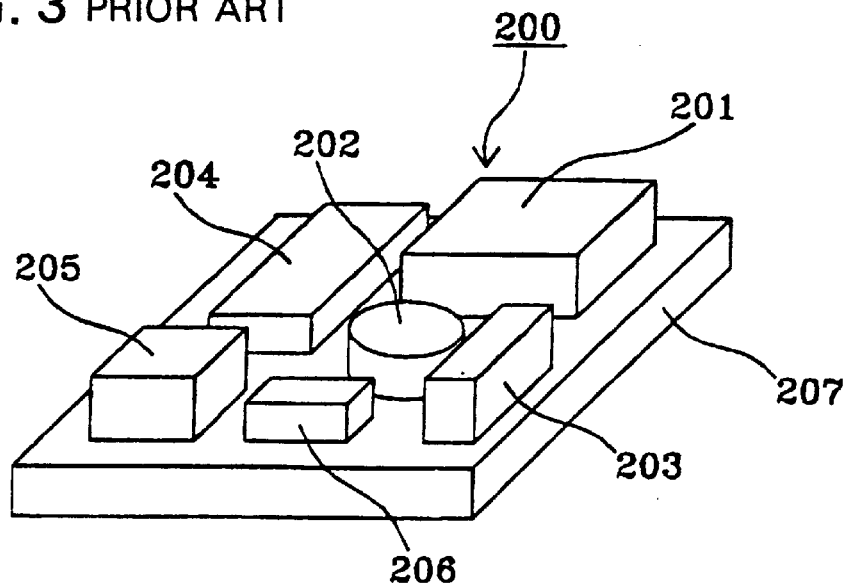
FIG. 3 is a perspective view illustrating an example of a conventional electronic device.
Figure 4:
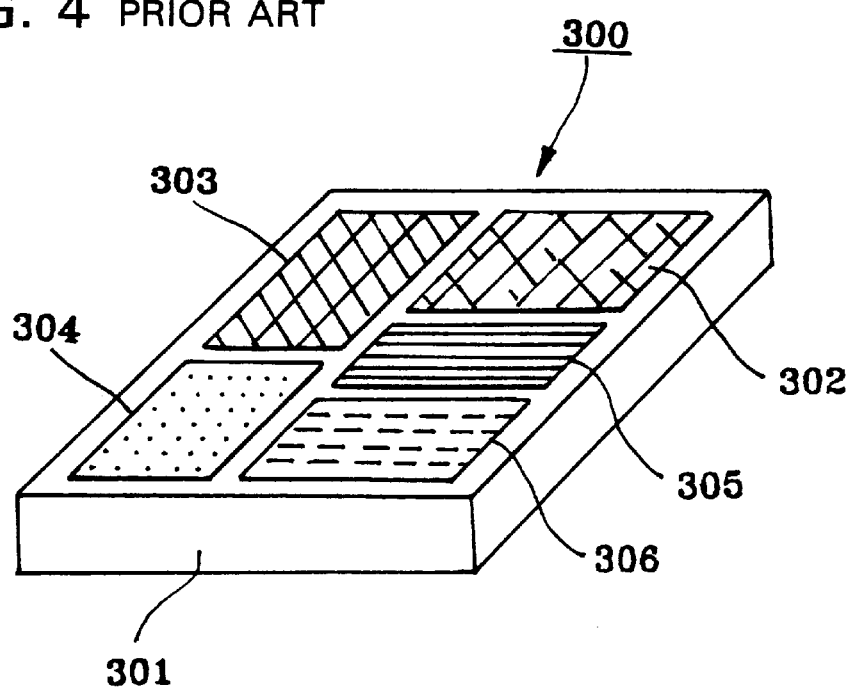
FIG. 4 is a perspective view illustrating another example of a conventional electronic device.

FIG. 1 shows an electronic device according to an embodiment of the present invention. FIG. 2 shows the block diagram of the electronic device shown in FIG. 1. FIGS. 1 and 2 show an example of a 21-GHz receiver. As shown in FIG. 1, the electronic device 100 is a multi-chip module in which a phase-locked-loop (PLL)-module IC 2, a surface-acoustic-wave (SAW)-resonator chip 3, high-dielectric-constant base-members 4 and 5, and a GaAs IC 6 are mounted on a package 1. The PLL-module IC 2 is provided with a TCXO input terminal 7, the high-dielectric-constant base-member 5 is provided with an RF input terminal 8, and the high-dielectric-constant base-member 4 is provided with an IF output terminal 9.

On the high-dielectric-constant base-members 4 and 5 are formed passive elements, namely filters, and matching circuits. In the GaAs IC 6, five identically structured FETs are independently formed. If necessary, however, these FETs may share a common line such as a bias line or a ground line. The respective devices on the package 1, namely, the PLL module IC 2, the SAW resonator chip 3, the FETs formed on the GaAs IC 6, and the passive elements formed on the high-dielectric-constant base-members 4 and 5 are connected with wires 10.

The relationship between the structure shown in FIG. 1 and the block diagram shown in FIG. 2 will be described.

The PLL module 11 and the SAW resonator 12 in FIG. 2 correspond to the PLL module IC 2 and the SAW resonator chip 3 in FIG. 1, respectively. Multipliers 13, 15, 17, 19 and 21 are formed on the GaAs IC 6 shown in FIG. 1. Filters 14 and 18 are formed on the high-dielectric-constant base-member 5 in FIG. 1, and filters 16 and 20 are formed on the high-dielectric-constant base-member 4 in FIG. 1. The matching circuits among the circuit elements are also formed on the high-dielectric-constant base-members 4 and 5 shown in FIG. 1, which are not shown in the block diagram in FIG. 2.

The electronic device shown in FIG. 2 operates as follows:

The PLL module 11 outputs a 1.25-GHz stable oscillating signal in accordance with a reference signal inputted from a TCXO input terminal 22. The frequency of the signal outputted from the PLL module 11 is doubled by each of the multipliers 13, 15, 17 and 19. The signal is inputted as a 20-GHz signal to a mixer 21, with unnecessary signal components removed by the filters 14, 16, 18 and 20 whenever the frequency is multiplied. In addition, a 21-GHz RF signal is inputted from an RF input terminal 23 to the mixer 21. In the mixer 21 the two input signals are mixed, and a frequency difference signal of 1 GHz is outputted from an IF output terminal 24.

The dielectric constant of the high-dielectric-constant base-members 4 and 5 is higher than approximately 13 which is the dielectric constant of the GaAs base-member. At high frequencies a distributed parameter circuit is chiefly used, in which the size of a circuit pattern is approximately proportional to the wavelength of a signal. In a distributed parameter circuit formed on a dielectric base-member the wavelength of a signal decreases in inverse proportion to the dielectric constant of the base-member. Thus, the wavelength of the signal is sufficiently smaller in the filters and the matching circuits formed on the high-dielectric-constant base-members 4 and 5 than in those formed on the GaAs base-member. This becomes striking as the dielectric constant of the high-dielectric-constant base-members 4 and 5 increases.

Since the GaAs IC 6 is formed by arranging FETs having identical structure and performance, it is a general-purpose IC which can be applied to purposes other than this embodiment. Accordingly, GaAs ICs of this type can be mass-produced, and the degree of integration of each IC is not so high, which provides a satisfactory yield, and enables use of the IC at relatively low cost.

Moreover, each GaAs IC and high-dielectric-constant base-member can be individually selected. Thus, the yield of final electronic devices formed by combining the selections to form a multi-chip module can be increased.

What is claimed is:

1. An electronic device including:
   at least one GaAs integrated circuit (IC) having a plurality of field-effect transistors (FETs) formed on a single GaAs base-member;
   at least one high dielectric constant base-member having one or more passive elements thereon, said one or more passive elements forming a distributed parameter circuit in which the size of the circuit pattern is proportional to a wavelength of the signal passing through said circuit, said high dielectric constant base member having a dielectric constant which is higher than that of said GaAs base-member;
   said FETs on said GaAs IC and said one or more passive elements located on said high dielectric constant base-member being connected together by interconnection elements to form a circuit and said GaAs base member only having said FETs and said interconnection elements thereon and said high dielectric constant base member only having said one or more passive elements and said interconnection elements thereon.

2. An electronic device according to claim 1, wherein the plurality of FETs formed on said GaAs base-member have an identical structure.

3. An electronic device according to claim 2, wherein said at least one GaAs IC and said at least one more high dielectric constant base-members are mounted in one package.

4. An electronic device according to claim 3, wherein the dielectric constant of said at least one high dielectric constant base-member is greater than the dielectric constant of said at least one GaAs base-member.

5. An electronic device according to claim 1, wherein said at least one GaAs IC and said at least one more high dielectric constant base-member are mounted in one package.

6. An electronic device according to claim 1, wherein said passive elements is disposed on a surface of said at least one high dielectric constant base-member.

7. An electronic device according to claim 1, wherein said passive elements is disposed within said at least one high dielectric constant base-member.

8. An electronic device according to claim 1, wherein said FETs are not directly electrically connected to one another.

9. An electronic device according to claim 8, wherein each of said FETs is indirectly electrically coupled to the remaining said FETs via at least one of said passive elements.

10. An electronic device according to claim 9, wherein said at least one passive element define a plurality of filters and wherein at least one such filter is electrically coupled between each of said FETs.

11. An electronic device according to claim 1, wherein said at least one passive element define a plurality of filters.

12. An electronic device according to claim 11, wherein said at least one passive element define a plurality of matching circuits.

13. An electronic device according to claim 1, wherein said at least one passive element define a plurality of matching circuits.

14. An electronic device according to claim 1 further including a phase lock loop circuit (PLL) and a surface acoustic wave resonator (SAW) electrically coupled to said FETs and said at least one passive element.

15. An electronic device according to claim 14, wherein said PLL, said SAW, said FETs and said at least one passive element are coupled in such a manner that said PLL and SAW cooperate for form a source of an oscillating signal and said FETs and said at least one passive element cooperate to increase the frequency of said oscillating signal.

* * * * *